United States Patent
Bendall

(10) Patent No.: US 6,407,603 B2
(45) Date of Patent: Jun. 18, 2002

(54) ANALOG VOLTAGE ISOLATION CIRCUIT

(75) Inventor: Clark Alexander Bendall, Syracuse, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/828,603

(22) Filed: Jun. 11, 2001

Related U.S. Application Data

(63) Continuation of application No. 09/399,263, filed on Sep. 20, 1999, now abandoned.

(51) Int. Cl.$^7$ ................................................ H03K 5/04
(52) U.S. Cl. ...................... 327/175; 327/172; 327/107; 363/74
(58) Field of Search ................................ 327/172, 173, 327/174, 175, 176, 177, 102, 333; 363/65, 74, 124

(56) References Cited

U.S. PATENT DOCUMENTS

| | | | | |
|---|---|---|---|---|
| 4,674,119 A | * | 6/1987 | Chea, Jr. ..................... | 379/400 |
| 4,739,174 A | * | 4/1988 | Nagano ....................... | 250/551 |
| 5,014,178 A | * | 5/1991 | Balakrishnan ............... | 363/49 |
| 5,438,294 A | * | 8/1995 | Smith .......................... | 327/304 |
| RE36,040 E | * | 1/1999 | Ou ............................... | 363/25 |
| 5,886,586 A | * | 3/1999 | Lai et al. ..................... | 327/176 |
| 5,999,433 A | * | 12/1999 | Hua et al. ................... | 363/132 |
| 6,028,491 A | * | 2/2000 | Stanchak et al. ........... | 327/175 |

* cited by examiner

Primary Examiner—Terry D. Cunningham
(74) Attorney, Agent, or Firm—Salzman & Levy

(57) ABSTRACT

An analog voltage isolation circuit includes an error amplifier-integrator having an error-output voltage, which is compared to a selected value referenced to the same ground potential as the input signal being measured. The comparator output varies the current flowing through the series-connected light-emitting diodes of first and second opto-isolators. The output of the first opto-isolator, with respect to the input ground potential, generates a first current feedback to the error amplifier-integrator, to establish both the frequency and duty-cycle of a rectangular-wave signal periodically varying proportional to the magnitude of the input voltage. The foregoing constitutes a first subcircuit for generating a pulse-width-modulated (PWM) electrical parameter having at least one of a frequency and a duty cycle variably responsive to an input signal value; the same periodically-varying current flows a second subcircuit, isolated from the first subcircuit, for converting the PWM parameter to an output signal substantially equal to the input signal. The current flows through the second opto-isolator input circuit, to generate an output voltage which varies substantially linearly with variance of the circuit input voltage signal, but is referenced to another ground potential, isolated from the input signal ground potential.

10 Claims, 2 Drawing Sheets

ANALOG VOLTAGE ISOLATION CIRCUIT

This Application is a Continuation of application Ser. No. 09/399,263, filed Sep. 20, 1999, now abandoned.

FIELD OF THE INVENTION

This invention relates to analog circuitry and, more particularly, to a novel analog voltage isolation circuit, which can be implemented with relatively few components, and at low cost.

BACKGROUND OF THE INVENTION

The coupling of an analog voltage from one location in an apparatus, such as a power supply, to another location within that same apparatus, can be complicated when the common, or reference, potentials at the different locations are not the same. It is well-known that certain apparatus, such as floating amplifiers or power supplies, higher-voltage power supplies and the like, can often contain sections thereof which are referenced to a common potential 'floating' tens, hundreds or even thousands of volts above or below a chassis potential, which itself may even be floating with respect to local earth ground potential. It is thus often necessary to isolate one analog voltage signal from others, especially with respect to different common potentials against which the analog signals are each referenced. In the past, isolated analog voltage measurements have been accomplished by use of isolation amplifiers (in discrete or integrated circuit form), pulse transformer circuitry, linear optically-coupled isolation circuitry (opto-isolators) and the like. Isolation amplifiers generally operate well, but are very expensive; pulse transformer circuits are somewhat less expensive as long as high accuracy is not required, but more precise measurements require complex circuitry and generate higher cost. Linear optically-coupled isolation circuits require special high-linearity, multiple-output opto-couplers, which are also relatively expensive and require a significant amount of support circuitry. Such opto-couplers also require either self-calibration circuitry or individual manual calibration of the circuit, to account for absolute gain differences between opto-coupler outputs.

A high-accuracy, low-cost novel analog voltage isolation circuit is thus desirable.

SUMMARY OF THE INVENTION

In accordance with the invention, a novel analog voltage isolation circuit includes a first subcircuit for generating a pulse-width-modulated (PWM) electrical parameter having at least one of a frequency and a duty cycle variably responsive to an input signal value, and a second subcircuit, isolated from the first subcircuit, for converting the PWM parameter to an output signal substantially equal to the input signal.

In a presently preferred embodiment, the first subcircuit includes an error amplifier-integrator having an error-output voltage for comparison to a selected level referenced to the same common potential as the input signal being measured. The comparator output varies the current flowing through the series-connected light-emitting diodes of first and second opto-isolators. The output of the first opto-isolator, with respect to the input ground potential, generates a first current feedback to the error amplifier-integrator, to establish both the frequency and duty-cycle of a rectangular-wave PWM signal periodically varying proportional to the magnitude of the input voltage. In the second subcircuit, the same periodically-varying current flows through the second opto-isolator input circuit, to generate an output voltage which varies substantially linearly with variance of the circuit input voltage signal, but is referenced to another common potential, isolated from the input common potential.

DETAILED DESCRIPTION OF THE INVENTION

Figure 1:
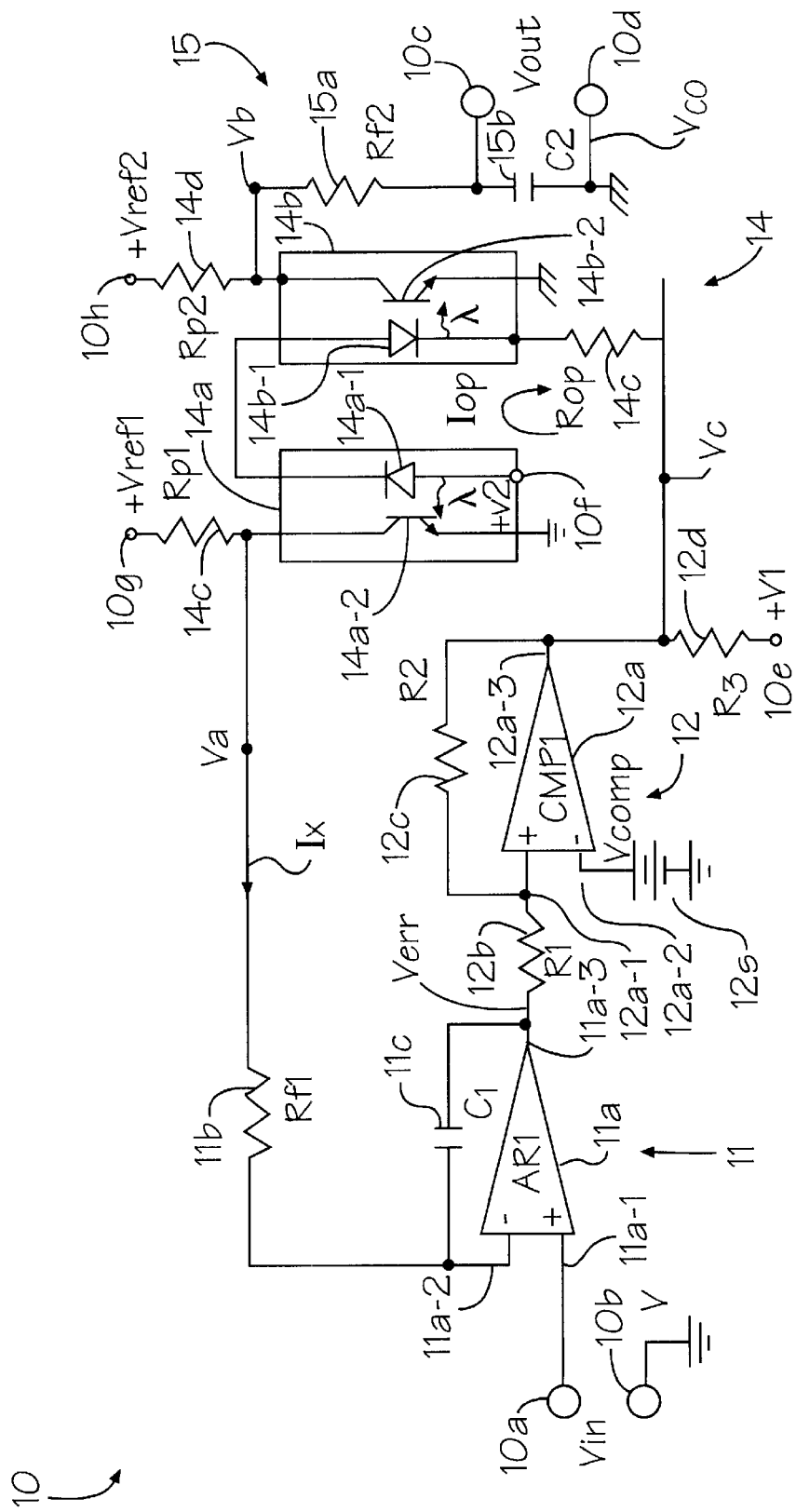
FIG. 1 is a schematic diagram of one implementation of the novel analog voltage isolation circuit of my invention.

Referring now to the Figures, a voltage isolation circuit 10 receives an analog input signal voltage Vin at an input terminal 10a, with respect to an input common potential Vci connected to input common terminal 10b. Circuit 10 generates an analog output signal voltage Vout at an output terminal 10c, with respect to an output common potential Vco at a output common terminal 10d. Vout is substantially equal to the magnitude of the input voltage Vin with respect to the associated input common potential. It will be seen that input common potential Vci at terminal 10b need not be, and usually is not, equal to the output common potential Vco at terminal 10d; in fact, it is contemplated that circuit 10 will find the majority of its use in situations where tens, hundreds or even thousands of volts difference exists between the common potentials at terminals 10b and 10d. Although the output common, or reference, potential is shown by a ground symbol, it should be understood that the output common potential for a particular usage of circuit 10 may itself be floating with respect to the potential of the chassis of the equipment in which circuit 10 is used. Even the chassis may float with respect to local earth ground potential.

The input analog signal Vin is coupled to an integrating amplifier stage 11; terminal 10a is connected to a first, non-inverting (+) input 11a-1 of an operational AR1 amplifier means 11a, having a second, inverting (−) input 11a-2 which is coupled through a first feedback resistance Rf1 element 11b to a signal Va point, and through an integration capacitance C1 element 11c to the output 11a-3 of differential amplifier 11a. The error voltage signal Verr at output 11a-3, with respect to the same common potential as the input common terminal 10b, as will be seen from its signal waveform (the top-most of the five waveforms in FIG. 2), is a set of alternatingly decreasing and increasing ramp segments 11d and 11e, respectively responsive to respective higher step voltage segments 11f and lower step voltage segments 11g of the Va point voltage (as shown in the fourth waveform of FIG. 2). The error signal is connected to a comparator stage 12.

Figure 2:
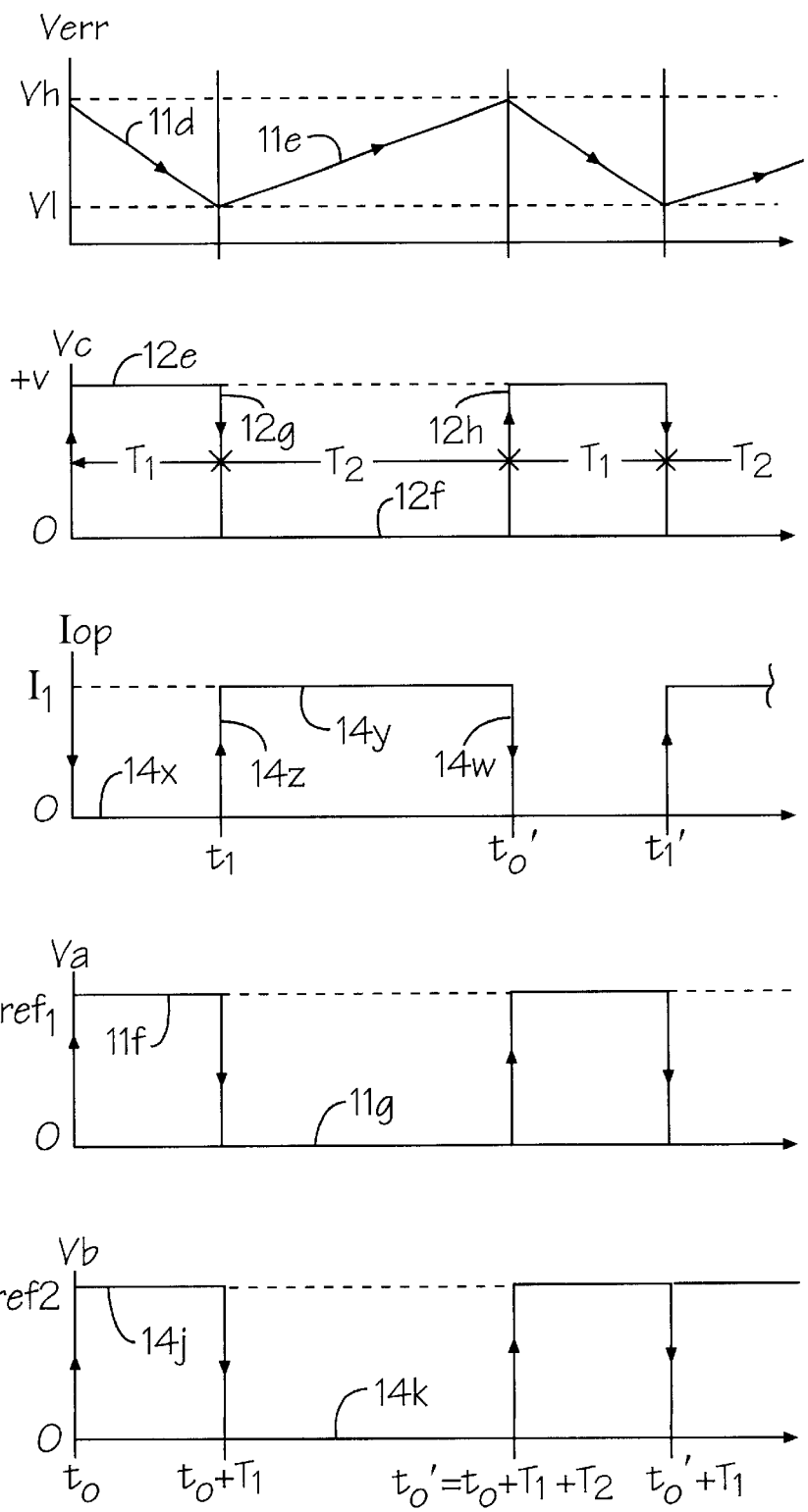
FIG. 2 is a set of interrelated signal waveforms illustrating the operation of the circuit of FIG. 1.

The comparator stage includes a comparator CMP1 means 12a (either or both of amplifier 11 and comparator 12 may be of discrete element design, although use of integrated-circuit operational amplifiers, including implementation in an ASIC and the like, may be preferred for many applications). The error voltage Verr is coupled through a first resistance R1 element 12b to a first, non-inverting (+) input 12a-1 of the comparator. The second, inverting (−) comparator input 12a-2 is connected to a fixed voltage Vcomp source 12s referenced to input common potential Vci; the fixed comparator voltage Vcomp can be of any magnitude within the range of error voltage Verr. A second resistance R2 element 12c is connected between first input 12a-1 and the comparator output 12a-3, which is also connected through a pull-up resistance R3 element 12d to a source of a first operating potential (+V1) at terminal 10e, with respect to the input common potential Vci. A comparator output signal Vc with a rectangular waveshape, having a greater level 12e and a lesser level 12f as shown in the second waveform of FIG. 2, is present at comparator output 12a-3 and its signal Vc point, for connection to an isolation stage 14.

In isolation stage 14, a pair of isolation means 14a and 14b are provided; the magnitude of an output parameter (e.g. output element 14a-2 or 14b-2 conduction) of each means is established responsive to the magnitude of an input parameter (e.g. the current flowing through an input element 14a-1 or 14b-1). By way of example only, each of means 14a and 14b is an opto-isolator, having an input element 14a-1 or 14b-1, such as a light-emitting diode and the like, from which photons are emitted responsive to the magnitude of a current Iop flowing therethrough, for establishing the conductance of an output element, such as a phototransistor 14a-2 or 14b-2 and the like, coupled to receive the diode photonic output. A large potential can exist between the separated input and output elements of the isolator means.

The signal Vc point is connected through an operating resistance Rop element 14c in series with both isolator means input elements 14a-1 and 14b-1, to a source of a second operating potential (+V2) provided at another input terminal 10f, with respect to input common potential Vci. As seen in the Iop signal waveform of FIG. 2, the second operating potential magnitude and the poling of the input devices 14a-1 and 14b-1 are such that a decreased value 14x of series operating current Iop will flow for a selected one (e.g., level 12e) of the binary levels of voltage Vc, with respect to the value 14y of current Iop flowing at the remaining one (e.g., level 12f) of the signal Vc binary levels. Responsive to the binary Iop current levels, the conduction of current through output load resistance Rp1 or Rp2 elements 14c or 14d, from respective reference voltage sources Vref1 or Vref2, respectively connected at terminals 10g or 10h, generates the respective Va or Vb signal voltages. It will be seen that first voltage Vref1, and thus signal voltage Va, is provided with respect to the input common potential Vci, while second voltage Vref2, and thus signal voltage Vb, is provided with respect to the output common potential Vco; both of the Va and Vb signals are shown in the lowest pair of waveforms of FIG. 2.

The pulse-width-modulated second signal Vb waveform is integrated by a low-pass filter section 15, having a resistance Rf2 element 15a connected in series between the second voltage Vb point and the circuit output terminal 10c, from which a filter capacitance C2 element 15b is connected to output common potential terminal 10d.

In operation, when first energized at time to, there is not operating current Iop flowing through elements 14a-1 and 14b-1 (as shown by current level 14x), so that elements 14a-2 and 14b-2 do not appreciably conduct and signal voltage Va level 11f is substantially equal to its associated reference supply voltage Vref1, and signal voltage Vb level 14j is substantially equal to its associated reference supply voltage Vref2. Voltage Vref1 is selected so that the maximum level 11f of signal Va voltage is greater than the largest positive level of input voltage Vin, so that integrator output signal Verr starts at a higher level Vh and decreases (portion 11d) until equal to the lower hysteresis voltage Vl of the comparator 12. Voltage Vl is set by comparator resistances R1 and R2, as well as voltage Vl. The time interval T1 required for portion 11d to decrease from value Vh to value Vl is:

$$T1=(Vh-Vl)*C1*(Rp1+Rf1)/(Vref1-Vin).$$

Thus, at a time t1=t0+T1, the comparator output voltage Vc transitions (edge 12g) from higher level 12e to lower level 12f. The operating current Iop transitions (edge 14z) to some value 14y, dependent on the values of voltage V2, Vc level 12f, the isolator input element voltage drops and the resistance Rop of element 14c. Resistance Rop is selected to cause sufficient current 14y to flow to saturate the output devices 14a-2 and 14b-2, whereby the signal voltages Va and Vb are each substantially zero, i.e., equal to the associated common potential level, as in portions 11g and 14k, respectively. Signal voltage Va is now less than input voltage Vin, causing the error voltage Verr to increase (portion 11e) for a time interval T2, until the upper voltage Vh is reached, with:

$$T2=(Vh-Vl)*C1*Rf1/Vin$$

where Vh is also set by the values of R1, R2 and V1. When, at time t0'=t1+T2=to+T1+T2, the upper hysteresis boundary is reached, the comparator output voltage Vc again transitions, with rising edge 12h, causing operating current Iop to decrease (edge 14w) substantially back to zero flow and driving Va to Vref1 and Vb to Vref2, for the cycle to begin anew. The voltage Vb waveform is thus seen to be a pulse-width-modulated (PWM) signal having an input voltage Vin dependent frequency F=1/(T1+T2) and a duty cycle DC=T1*F=T1/(T1+T2).

If circuit 10 is designed such that: (a) the resistance Rf1 of element 11b is equal to the resistance Rf2 of element 15a; (b) the resistance Rp1 of element 14c is equal to the resistance Rp2 of element 14d; and (c) the magnitude Vref1 of the first reference voltage with respect to the associated common input potential Vci is equal to the magnitude Vref2 of the second reference voltage with respect to the associated common output potential Vco, then the averages of each of the Va and Vb voltages will be equal. That is, the integrating stage 11 forces the frequency and duty-cycle of the PWM signal to have an average Va value (and therefore the average Vb value) equal to the input Vin voltage; filter section 15 smoothes the Vb switching waveform to provide the DC value of output voltage Vout substantially equal to the DC value of the input voltage Vin.

It will be understood that the PWM frequency must be set significantly higher than any input voltage Vin frequency components to be measured or translated from input to output, over the entire range thereof of Vin. Alternatively, if a frequency variation can not be tolerated, any form of simple timing circuit known to the art can be used to generate a fixed-frequency sawtooth waveform in place of the fixed voltage at comparator input 12a-2; capacitance C1 must then be increased to make error voltage Verr to be essentially a DC voltage. Conversely, the PWM frequency must also be low enough such that differences in opto-coupler 14 switching delays are insignificant over the entire desired range of input voltage Vin. Any difference in magnitude of the reference voltages Vref1 and Vref2 can be directly translated into measurement error, as can any difference in opto-coupler saturation voltages. The latter can be reduced by adding a buffer stage (with a bipolar or field-effect transistor) to the output of each of means 14a and 14b (i.e., in parallel with output elements 14a-2 and 14b-2); the addition of a buffer stage may also reduce opto-coupler switching speed errors.

It will now be apparent to those skilled in the art that my novel analog voltage isolation circuit can provide a highly accurate isolator at low parts count and low cost. Many variations and modifications will now become apparent to those skilled in the art; it is my intent to be limited only by the scope of the appending claims and not by way of the elements or instrumentalities described for this one embodiment.

What is claimed is:

1. An analog voltage isolation circuit for generating a time-varying analog output signal having a value relative to an output common potential, said time-varying analog output signal varying in amplitude responsive to a change in amplitude of a value of a time-varying analog input signal, said time-varying analog input signal being relative to an input common potential, said input common potential being independent of said output common potential, comprising:

a first subcircuit referenced to said input common potential for generating a pulse-width-modulated (PWM) electrical parameter having at least one of a frequency and a duty cycle variably responsive to said value of said time-varying analog input signal; and a second subcircuit referenced to said output common potential and electrically isolated from said first subcircuit, for converting said PWM electrical parameter to said value of said time-varying analog output signal for tracking and ensuring a substantially equal amplitude to the value of said time-varying analog input signal;

whereby said time-varying analog output signal referenced to said output common potential is isolated from said time-varying analog input signal referenced to said input common potential.

2. The circuit of claim 1, wherein said first subcircuit comprises: integrator means for providing an error signal representative of a difference between said analog input signal and a first reference signal; and comparison means for generating said PWM signal with at least one characteristic of frequency and duty-cycle being responsive to said error signal, said first subcircuit further comprising means responsive to said PWM signal for providing said first reference signal.

3. The circuit of claim 2, wherein said integrator means includes: an operational amplifier having a first input receiving said input signal, a second input coupled to receive said first signal through a resistive element, and an output, at which said error signal appears, coupled to said second input through an integrating element means.

4. The circuit of claim 3, wherein said integrating element means is a feedback capacitance element.

5. The circuit of claim 2, wherein said comparison means has a comparison reference potential equal to a preselected voltage referenced to said input common potential, and a controlled amount of hysteresis.

6. The circuit of claim 2, wherein said first means is a first opto-isolator having an input element generating photonic flux responsive to the PWM signal and an output element operating to provide said first signal responsive to said photonic flux.

7. The circuit of claim 2, wherein said second subcircuit comprises: second means for providing another PWM signal, electrically isolated from said first signal and from said amplifier, comparison and first means, having an average value substantially equal to an average value of said input signal; and filtering means for recovering the average value of said another PWM signal as said output signal.

8. The circuit of claim 2, wherein said second means is a second opto-isolator having an input element generating another photonic flux responsive to the PWM signal and an output element operating to provide said second first signal responsive to said another photonic flux.

9. The circuit of claim 7, wherein said filtering means comprises a low-pass filter.

10. The circuit of claim 9, wherein said low-pass filter includes a series resistance element and a shunt capacitive element.

* * * * *